(12) United States Patent
Johnson

(10) Patent No.: US 7,476,905 B2
(45) Date of Patent: Jan. 13, 2009

(54) SECURING A TRANSISTOR OUTLINE CAN WITHIN AN OPTICAL COMPONENT

(75) Inventor: Christopher William Johnson, Sasche, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/254,633

(22) Filed: Oct. 20, 2005

(65) Prior Publication Data
US 2006/0086947 A1  Apr. 27, 2006

Related U.S. Application Data

(60) Provisional application No. 60/621,711, filed on Oct. 25, 2004.

(51) Int. Cl.
*H01L 31/12* (2006.01)

(52) U.S. Cl. .................. 257/82; 257/E33.056; 385/80; 385/88

(58) Field of Classification Search .................. 257/82, 257/E33.056; 385/80, 88
See application file for complete search history.

(56) References Cited

U.S. PATENT DOCUMENTS

| 4,399,453 | A | * | 8/1983 | Berg et al. .................. 257/712 |
| 5,522,001 | A | * | 5/1996 | Meadowcroft ............... 385/88 |
| 6,069,905 | A | * | 5/2000 | Davis et al. ............. 372/50.124 |
| 2003/0185525 | A1 | * | 10/2003 | Lacy et al. ..................... 385/92 |

* cited by examiner

*Primary Examiner*—A. Sefer
*Assistant Examiner*—Eduardo A Rodela
(74) *Attorney, Agent, or Firm*—Workman Nydegger

(57) ABSTRACT

The present invention relates to affixing components of optical packages. The optical packages can include an optical component, such as a TO-Can. The TO-Can can house an optical transmitter and/or an optical receiver. Another optical component of the optical package can be a barrel for aligning the TO-Can with an optical fiber. The TO-Can can be affixed within an open end of the optical barrel using a bonding substance, such as an epoxy, that has wicking properties. The wicking properties cause the bonding substance to enter a gap between the optical barrel and the TO-Can by capillary action. Use of the bonding substance with wicking properties creates a more robust optical package in a cost effective manner.

10 Claims, 2 Drawing Sheets

SECURING A TRANSISTOR OUTLINE CAN WITHIN AN OPTICAL COMPONENT

CROSS-REFERENCE TO RELATED APPLICATIONS

This application claims the benefit of U.S. Provisional Application No. 60/621,711, titled "SECURING A TRANSISTOR OUTLINE CAN WITHIN AN OPTICAL COMPONENT" filed Oct. 25, 2004, which is incorporated herein by reference.

BACKGROUND OF THE INVENTION

1. The Field of the Invention

The present invention relates generally to fiber optic communication. More specifically, the present invention relates to methods, apparatuses, and systems for providing robust fiber optic packages, components, and assemblies.

2. The Relevant Technology

Fiber optic technology is increasingly employed in the transmission of data over communication networks. Networks employing fiber optic technology are known as optical communications networks, and are typically characterized by high bandwidth and reliable, high-speed data transmission.

To communicate over an optical communications network using fiber optic technology, fiber optic components such as fiber optic transceivers are used to send and receive optical data. Generally, a fiber optic transceiver can include one or more optical subassemblies ("OSA") having an optical transducer, such as a transmitter optical subassembly ("TOSA") having an electro-optical transducer for sending optical signals, and a receiver optical subassembly ("ROSA") having an opto-electronic transducer for receiving optical signals. More particularly, the TOSA receives an electrical data signal and converts the electrical data signal into an optical data signal for transmission onto an optical network. The ROSA receives an optical data signal from the optical network and converts the received optical data signal to an electrical data signal for further use and/or processing. Both the ROSA and the TOSA include specific optical components for performing such functions.

In particular, a typical TOSA includes an optical transmitter such as a light emitting diode or a laser diode located on a header, for transmitting an optical signal to an optical fiber. A monitor diode may be included on the header to receive at least a portion of the optical transmission of the optical transmitter for providing feedback related to the optical transmission. The optical transmitter is typically covered by an at least partially transparent cap that protects the optical transmitter while allowing the optical transmitter to transmit the optical data signal to the optical cable. The cap may include a lens for focusing the optical signal transmission.

A typical ROSA includes an optical receiver, such as a PIN photodiode or avalanche photodiode ("APD"), located on a header. The optical receiver is typically covered by an at least partially transparent cap that protects the optical receiver and allows the optical receiver to receive an optical data signal from an optical cable. The cap may include a lens for focusing the optical signal transmission received from the optical cable.

The TOSA and ROSA components are assembled into packages and the packages typically include a plastic barrel to align and couple the end of a fiber optic cable for transmission of an optical signal to the optical receiver, or from the optical transmitter. When assembled into packages, the TOSA and ROSA assemblies may be subject to temperature extremes and various forces in a number of directions. These forces may be applied in an axial direction, for example, to electrical leads, often called feed throughs, which supply power to the optical components located upon the header. The TOSA and ROSA assemblies must maintain optical alignment for maximum power transmission notwithstanding these forces and conditions.

One common type of component is the TO-Can component. The TO-Can component comes in several different sizes and configurations. Referring to FIG. 1, a typical TO-Can 1, for example a TO-46 style component, is shown. The TO-Can 1 has a tilted window 2. The TO-Can 1 has relatively short vertical sidewall sections 3 followed by relatively long sloped sidewall sections 4. The sloped sidewall sections 4 are sloped inward toward the center of the component prior to joining the tilted window 2 located on the top of TO-Can 1.

Referring now to FIG. 2, a cross sectional illustration of a TO-Can 1 (from FIG. 1) assembled into an LC package 10, for example a TO-46 LC package, is shown. The TO-Can 1 includes a header 5, a monitor diode 6, and a vertical cavity surface emitting laser ("VCSEL") 7. The LC package 10 also includes a barrel 8. The barrel 8 has an open first end 8A that is sized and configured to receive the TO-Can 1, and an open second end 8B that is sized and configured to receive an optical fiber 9. The barrel 8 is further configured to align the optical fiber 9 with an optical transmission from the VCSEL 7. According to this embodiment, the tilted window 2 is angled so as to reflect a portion of the optical transmission from the VCSEL 7 to the monitor diode 6.

As shown in FIG. 2, the TO-Can 1 is attached to the barrel 8 using a welding epoxy 11. The welding epoxy 11 is applied about the bottom of the TO-Can 1. The mechanical stability of the TO-Can 1 within the open end 8A is dependent on the strength of the bond between TO-Can 1 and barrel 8 created by welding epoxy 11.

Referring now to FIG. 3, a side view illustration of a TO-Can 12 (e.g. a TO-56 component) is shown assembled into an LC package 13 (e.g. a TO-56 LC package). A welding epoxy 11 has been used to attach a header 14 of the TO-Can 12 to a barrel 15 of the LC package 13. Typically a bead of welding epoxy 11 is beaded on surface 18 to fill the gap 17 between the header 14 and the barrel 15 similar to that discussed above with respect to FIG. 2.

Industry standards continue to decrease the size of fiber optic components and optical packages, while increasing port density. As component size decreases, the ability to maintain alignment between components through temperature extremes becomes increasingly more difficult. In some environments, the typical method of beading a welding epoxy to secure the TO-Can component to a barrel of a fiber optic package does not provide the stability needed to withstand axial loads under various temperature conditions. Thus, when the movement due to axial loads is great enough to cause misalignment (e.g., of a VCSEL with a corresponding optical fiber caused by movement of a TO-Can and barrel relative to each other), optical power loss during optical transmission can occur.

Therefore, what would be advantageous are methods, apparatuses, and systems for robust fiber optic packages, components, and assemblies.

BRIEF SUMMARY

The present invention relates to affixing components of optical packages. An optical package is disclosed. The optical package can include an optical component. The optical component can include sidewalls having a substantially vertical sidewall section, a header, and an optical transducer coupled to the header. The optical package can further include a barrel having an open first end and an open second end. The open first end can be sized and configured to receive at least a portion of the optical component. The open second end can be sized and configured to receive an optical cable. The optical component can be at least partially received within the first end of the barrel thereby creating a gap between an outer surface of the substantially vertical sidewall section and an inner surface of the barrel. The optical package can further include an attaching means having wicking properties. The attaching means can be at least partially located within the gap between the substantially vertical sidewall section and the inner surface of the barrel. The attaching means bonds a substantial portion of the substantially vertical sidewall section to the barrel.

A method for securing a TO-Can within an opening is described. The TO-Can includes substantially vertical sidewall portions. The opening includes substantially vertical inner surfaces configured to receive at least a portion of the substantially vertical sidewall portions. The method includes securing the substantially vertical sidewall portions to the inner surfaces using a wicking epoxy. The wicking epoxy has a molecular attraction of molecules to the solid surfaces of the sidewall portions and inner surfaces that overcomes the viscosity of the wicking epoxy thereby drawing the epoxy into a space between the sidewall portions and the inner surfaces as a result of capillary action.

A method of manufacturing an optical package is disclosed. The optical package includes an optical component and an optical barrel. The optical component has sidewalls with a substantially vertical sidewall section. The method of manufacturing the optical package includes receiving the optical component at least partially within an opening of the barrel thereby creating a gap between the substantially vertical sidewall section and an inner surface of the barrel. The method further includes bonding the outer surface of the substantially vertical sidewall section to the inner surface of the barrel using a bonding substance having wicking properties. The wicking properties cause the bonding substance to enter the gap between the outer surface of the substantially vertical sidewall section and the inner surface of the barrel as an effect of capillary action.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention.

Figure 1:
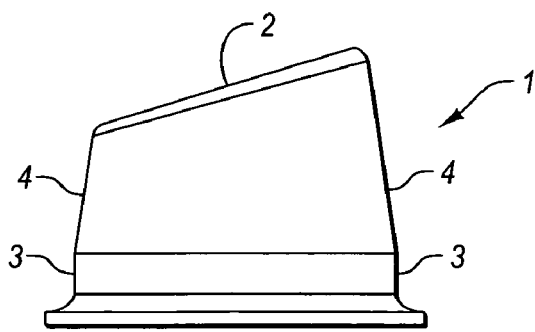
FIG. 1 illustrates a conventional TO-Can style component.
Figure 2:
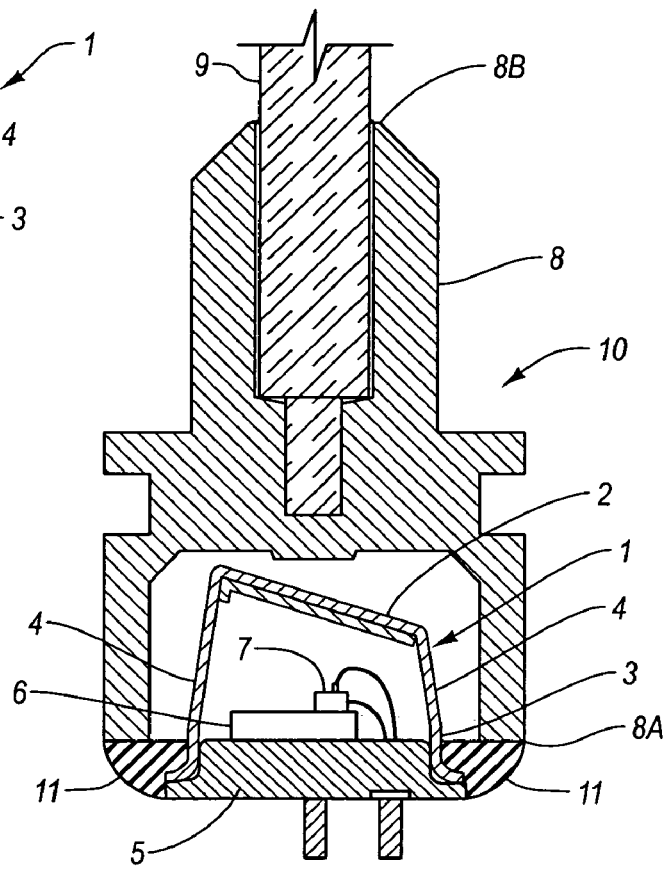
FIG. 2 illustrates a cross sectional view of a conventional TO-Can style component assembled into an LC package.
Figure 3:
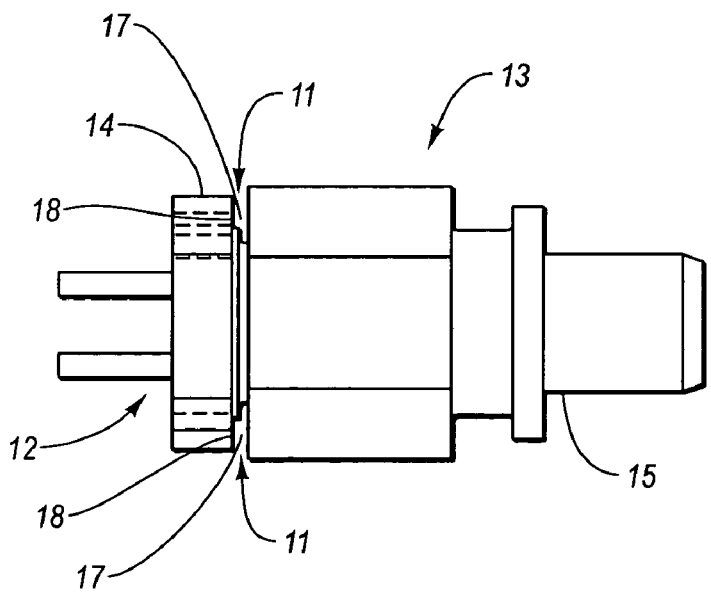
FIG. 3 illustrates a side view of a conventional TO-Can style component assembled into an LC package.
Figure 4:
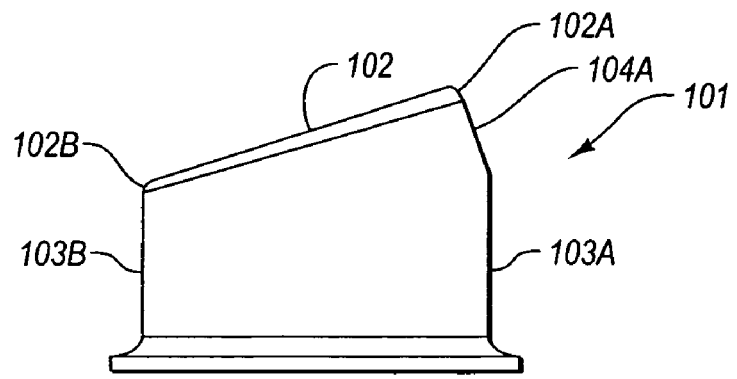
FIG. 4 illustrates a TO-Can style component according to an example embodiment of the present invention.

Referring to FIG. 4, a TO-Can 101 (e.g. a TO-46 style emitter component) is shown according to an example embodiment of the present invention. The TO-Can 101 has a tilted window 102 having a higher end 102A and a lower end 102B. The TO-Can has side walls with substantially vertical sidewall sections 103A and 103B and a sloped section 104A. More specifically, the substantially vertical section 103B of the sidewalls that meets the lower end 102B of the tilted window 102 is substantially vertical the entire length of the wall. The substantially vertical wall section 103A that meets sloped section 104A is substantially vertical over half the distance of the sidewall.

Figure 5:
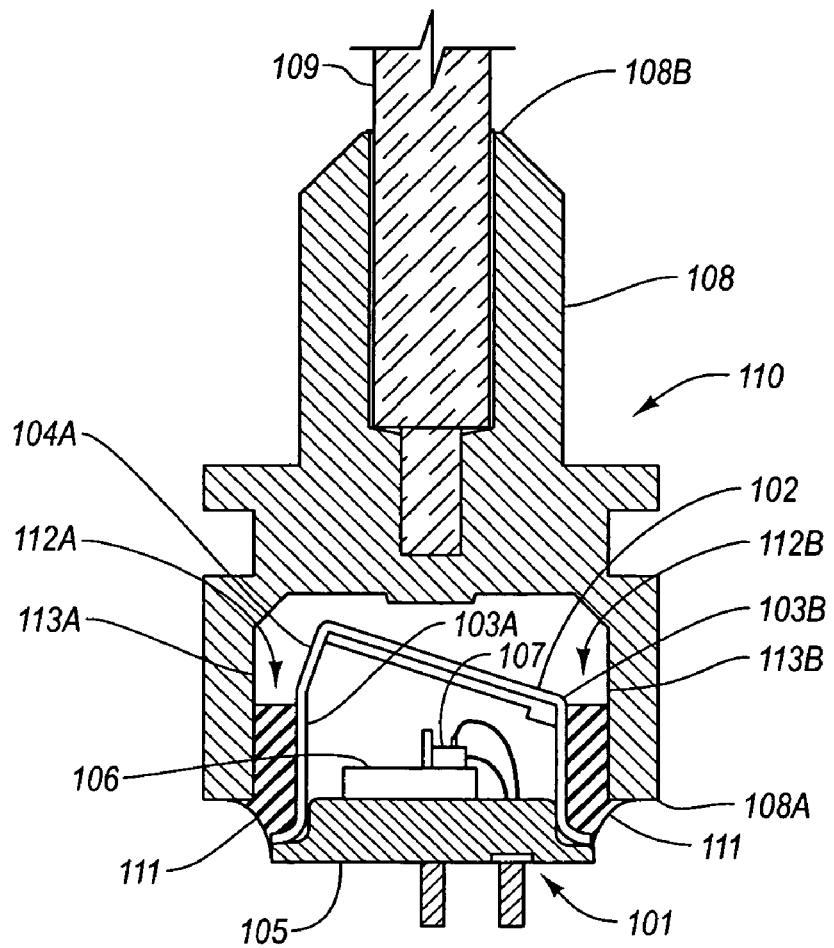
FIG. 5 illustrates a cross sectional view of a TO-Can component assembled into an LC package according to an example embodiment of the present invention.

Referring now to FIG. 5, the TO-Can 101 (e.g. the TO-Can from FIG. 4) is shown assembled into an LC package 110 according to one example embodiment of the present invention. Referring still to FIG. 5, the TO-Can 101 includes a header 105, a monitor diode 106, and a vertical cavity surface emitting laser ("VCSEL") 107. The LC package 110 includes a barrel 108, the barrel 108 has a first open end 108A that is sized and configured to receive the TO-Can 101, and a second end 108B that is sized and configured to receive an optical fiber 109. The barrel 108 is further configured to align the optical fiber 109 with an optical transmission from the VCSEL 107. The tilted window 102 is angled so as to reflect a portion of the optical transmission from the VCSEL 107 to the monitor diode 106. Upon insertion of the TO-Can 101 into the barrel 108, gaps 112A and 112B are formed between the substantially vertical sidewall sections 103A and 103B and inside surfaces 113A and 113B.

The TO-Can 101 is attached to the barrel 108 using a wicking epoxy 111. The wicking epoxy 111 is applied about the bottom of the TO-Can 101. The wicking epoxy 111 may be created or chosen for its capillary properties, which facilitate the flow of the wicking epoxy 111 into gaps 112A and 112B by capillary. Wicking epoxies are epoxies selected, or configured, to have certain viscosity and adhesion properties whereby the wicking epoxies are drawn inside the gaps 112A and 112B. For example, a capillary effect occurs when the adhesive forces between the epoxy and the sidewalls of gaps 112A and 112B exceed the cohesive forces related to the viscosity of the epoxy. Similarly, in the case of metal components (i.e. a metal TO-Can 101 and a metal barrel 108), a wicking solder may be used to attach the TO-Can 101 to the barrel 108. Therefore, a wicking metallic solder, or other bonding substance with wicking properties, may be used in certain situations where the wicking metallic solder provides the proper mechanical bond between the TO-Can 101 and the barrel 108 similar to that described with reference to the wicking epoxy 111.

The lengths of the vertical sidewall sections 103A and 103B provide a larger surface area for the wicking epoxy 111

(or when appropriate, wicking solder) to adhere to, thereby resulting in better mechanical strength. The sloped sidewall section 104A may be configured to slope from the substantially vertical sidewall sections 103A at a predetermined point, thereby stopping the capillary action of the wicking epoxy 111 at a particular point (i.e. at a particular height) along the sidewalls 103A and 103B (for example as shown in FIG. 5).

While the example embodiments shown in FIG. 4 and FIG. 5 are described with reference to a TO-Can having relatively long substantially vertical sidewalls, it would be apparent to one of ordinary skill in the art in view of this disclosure that the same wicking material can be used to secure other fiber optic component designs, such as other component designs and package designs. For example, while TO-Can component designs have been described as part of an optical package, other component designs may be affixed within other optical packages using a wicking epoxy to produce a more robust mechanical bond between the component and the package.

In addition, the present invention has been described with reference to an LC type emitter package including a TOSA. Another embodiment of the invention includes, for example, affixing a ROSA within a detector package using wicking epoxy in a manner similar to that described above.

Moreover, embodiments of the invention may be implemented to affix fiber optic components within other types of fiber optic packages in addition to the LC package. For example, a wicking epoxy can be used to create a more robust mechanical bond between optical components within, for example, a ST package, SC package, FC package, SMA package, pigtail package, or any other optical package.

Moreover, embodiments of the present invention may be applied to other fiber optic assemblies where a fiber optic component is affixed within a sleeve, and must withstand axial forces in a range of environmental conditions. The present invention may result in lower cost solutions for affixing components of optical assemblies.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical package comprising:
   an optical component comprising:
      sidewalls having a substantially vertical sidewall section;
      a header; and
      an optical transducer coupled to the header;
   a barrel having an open first end and an open second end, wherein:
      the open first end is sized and configured to receive at least a portion of the optical component;
      the open second end is sized and configured to receive an optical cable; and
      the optical component is at least partially received within the open first end of the barrel thereby creating a gap between an outer surface of the substantially vertical sidewall section and an inner surface of the barrel; and
   an attaching means having wicking properties, wherein:
      the attaching means is at least partially located within the gap between the substantially vertical sidewall section and the inner surface of the barrel;
      the attaching means is wider than the vertical sidewall section of the optical component at a location within the gap between the substantially vertical sidewall section and the inner surface of the barrel;
      the sidewalls include a sloped sidewall section
      the sloped sidewall section is configured to slope from the substantially vertical sidewall section at a predetermined point to stop capillary action of the attaching means; and
      the attaching means bonds a substantial portion of the substantially vertical sidewall section to the inner surface of the barrel.

2. The optical package according to claim 1, wherein the attaching means is at least one of an epoxy, solder, adhesive, or glue.

3. The optical package according to claim 1, wherein the optical transducer is an optical transmitter or an optical receiver.

4. The optical package according to claim 3, wherein the optical transducer is an optical transmitter, the optical component further comprising:
   a monitor diode coupled to the header; and
   a tilted can window for reflecting at least a portion of an optical transmission from the optical transmitter to the monitor diode.

5. The optical package according to claim 1, wherein the optical transducer is a vertical cavity surface emitting laser ("VCSEL") or a photodiode.

6. The optical package according to claim 1, wherein the optical component is a TO-Can component.

7. The optical package according to claim 1, wherein the optical component is a TO-46 or a TO-56 component.

8. The optical package according to claim 1, wherein the optical package is an LC package, ST package, SC package, FC package, SMA package, or pigtail package.

9. The optical package according to claim 1, wherein the attaching means includes solder.

10. The optical package according to claim 9, wherein the substantially vertical sidewall section and the inner surface of the barrel include metal.

* * * * *

UNITED STATES PATENT AND TRADEMARK OFFICE
CERTIFICATE OF CORRECTION

| | | |
|---|---|---|
| PATENT NO. | : 7,476,905 B2 | |
| APPLICATION NO. | : 11/254633 | |
| DATED | : January 13, 2009 | |
| INVENTOR(S) | : Johnson | |

It is certified that error appears in the above-identified patent and that said Letters Patent is hereby corrected as shown below:

Column 4
Line 51, change "capillary" to --capillary action--

Column 6
Line 18, change "section" to --section;--

Signed and Sealed this
First Day of March, 2011

David J. Kappos
*Director of the United States Patent and Trademark Office*